United States Patent [19]

Malshe et al.

[11] Patent Number: 5,472,370
[45] Date of Patent: Dec. 5, 1995

[54] METHOD OF PLANARIZING POLYCRYSTALLINE DIAMONDS, PLANARIZED POLYCRYSTALLINE DIAMONDS AND PRODUCTS MADE THEREFROM

[75] Inventors: Ajay P. Malshe; William D. Brown; Hameed A. Naseem; Leonard W. Schaper, all of Fayetteville, Ark.

[73] Assignee: University of Arkansas, Little Rock, Ark.

[21] Appl. No.: 282,796

[22] Filed: Jul. 29, 1994

[51] Int. Cl.$^6$ .................................................. B24B 1/00
[52] U.S. Cl. .................................... 451/41; 451/54; 51/295; 51/307
[58] Field of Search ................................ 451/41, 54, 285, 451/287, 398, 550; 51/295, 307; 216/52, 38, 39; 156/636.1, 645.1

[56] References Cited

U.S. PATENT DOCUMENTS

| | | | |
|---|---|---|---|
| 4,662,348 | 5/1987 | Hall et al. | 451/41 |
| 4,925,701 | 5/1990 | Jansen et al. | 427/38 |
| 5,017,403 | 5/1991 | Pang et al. | 216/38 |
| 5,154,023 | 10/1992 | Sioshansi | 451/54 |
| 5,216,843 | 6/1993 | Breivogel et al. | 451/287 |
| 5,225,275 | 7/1993 | Aida | 428/334 |
| 5,250,472 | 10/1993 | Chen et al. | 216/38 |
| 5,300,188 | 4/1994 | Tessmer et al. | 156/636 |
| 5,346,584 | 9/1994 | Nasr et al. | 156/636.1 |
| 5,364,423 | 11/1994 | Bigelow et al. | 51/293 |
| 5,366,579 | 11/1994 | Yamazaki et al. | 156/247 |

Primary Examiner—Bruce M. Kisliuk
Assistant Examiner—Derris Banks
Attorney, Agent, or Firm—Gilbreth & Adler

[57] ABSTRACT

Disclosed is a method of planarizing a diamond film which generally includes orifices in the surface. The method includes first polishing the diamond film surface to reduce the surface roughness. Next, a filler material is applied to the surface of the film to fill the orifices in the film. Finally, the film is polished to remove excess filler material and expose the diamond film surface. Also disclosed are planarized diamond films diamond substrate having a polished surface of both diamond and filler material and a variation in thickness of less than 8 percent.

27 Claims, 3 Drawing Sheets

METHOD OF PLANARIZING POLYCRYSTALLINE DIAMONDS, PLANARIZED POLYCRYSTALLINE DIAMONDS AND PRODUCTS MADE THEREFROM

BACKGROUND OF THE INVENTION

1. Field of the Invention

The present invention relates to diamonds and diamond-like materials and to products made thereof. In another aspect, the present invention relates to planarized diamond films and diamond-like material films and to products made thereof. In still another aspect, the present invention relates to polished and planarized diamond films and diamond-like material films and to products made thereof. In even another aspect, the present invention relates to polished and planarized polycrystalline diamond films, to products made thereof, and to a method of polishing and planarizing polycrystalline diamond films.

2. Description of the Related Art

Diamond films are finding use in a multitude of applications, including electrical applications. To be useful, such films must be not only highly polished but must also have a high degree of planarity.

The degree of polish generally refers to the average surface roughness, whereas planarity generally refers to the waviness of the film or the variation in thickness of the film.

While techniques do exist for the polishing of diamond films, they generally do not provide the required degree of planarity.

The applicability of diamond films are a result of their physical and chemical properties which render them suitable for use in a wide range of applications. For example, natural diamonds are the hardest substance known and exhibit low friction and wear properties. Specifically, a natural diamond's thermal conductivity, thermal diffusivity properties, electrical resistivity and microhardness invite its application in various applications.

As the physical and chemical properties of synthetic diamond films have been found to be comparable to those of bulk natural diamond, it is believed that diamond films will also be used in a broad range of applications.

For example, it has been reported that typical chemical vapor deposited films have electrical resistivities greater than $10^{13}$ $\Omega$-cm, a microhardness of about 10,000 HV or higher, a thermal conductivity of about 1100 W m$^{-1}$ K$^{-1}$ or higher, and thermal diffusivity of 200 to 300 mm$^2$/s. These reported values for deposited diamond films compare favorably to the same properties of natural diamond, i.e, resistivities in the range of $10^7$ to $10^{20}$ $\Omega$-cm, a microhardness in the range of 8,000 to 10,400 HV, a thermal conductivity in the range of 900 to 2000 W m$^{-1}$ K$^{-1}$, and a thermal diffusivity of 490 to 1150 mm$^2$/s. Thermal gravimetric analysis demonstrates that the oxidation rates of diamond films in air are lower than those of natural diamond. Additionally, it is reported that the minimum starting temperature for the oxidation of microwave-assisted chemical vapor deposited diamond films is about 800° C., as evidenced by weight loss, while the morphology shows visible oxidation etching pits at temperatures as low as 600° C.

Diamond films are not naturally occurring, but rather must be manufactured using any of a host of techniques, such as, chemical vapor deposition, physical vapor deposition, plasma spray or cathode sputtering.

The growth of diamond film on a nondiamond substrate is initiated by nucleation either at randomly seeded sites or at thermally favored sites. Based on growth temperature and pressure conditions, favored crystal orientations dominate the competitive growth process. As a result, the grown films are polycrystalline in nature with relatively large grain size, generally greater than one micron, terminating in rough surfaces with the roughness ranging from about a few tenths of a micron to tens of microns. Such films offer insufficient planar areas and will likely not be suitable for most applications, in particular for thermal management applications.

While acceptable surface smoothness is perhaps the major constraint for the widespread use of diamond films in thermal management, electrical, optical and tribological applications. Another very important characteristic of polished diamond surfaces is waviness, the periodic or aperiodic wave-like variation from a perfectly planar surface, which is generally much larger and wider than the roughness. Depending upon the application of the product, waviness may be undesirable while minute scratches can be tolerated. For example, in gauge blocks, the polished steel surface has little waviness, but on a microscopic scale is scratched.

As is well known, diamond is the hardest substance known and is therefore difficult to polish. In general, abrasive polishing techniques require the use of a mating/polishing grit material of equal or greater hardness than the material to be polished. While other materials may be polished utilizing harder substances, diamond films are generally abrasively polished only with diamonds.

Various prior art methods have been suggested to improve upon the abrasive polishing of diamond films. For example, in "Polishing diamonds in the presence of oxidizing agents", Thornton et al., Diamond Research 1974, Supplement to Industrial Review, pp. 39 (1974), it is disclosed that the polishing of a natural diamond stone with diamond powder and an iron scaife may be enhanced by first applying a concentrated aqueous solution of potassium nitrate on the iron scaife.

Typically, polishing with diamond powder commences with a relatively coarse hard powder which continuously scratches the surface of the material being polished until all of the scratches remaining on the surface are as small as can be made with that size powder. The next step is to polish with a smaller size powder until all of the larger scratches are removed and the only remaining scratches are the smallest that can be produced with this second size powder. This continues with successively smaller powder sizes until the desired degree of polishing is obtained. Obviously, the degree of polish of the finish will always depend on the size of powder utilized.

Hall et al. U.S. Pat. No. 4,662,348, issued May 5, 1987 discloses a method for burnishing a diamond which eliminates the necessity of diamond powder. As disclosed, a polished diamond surface is obtained by rubbing the surface of the diamond to be polished against a smooth complementary diamond surface with sufficient pressure and velocity to heat the surface being polished above the spontaneous thermal degradation temperature of the diamond.

Unfortunately, traditional abrasive polishing methods utilizing diamond powder or complementary surfaces are unsuitable for diamond films because of extremely low polishing rates and preferential polishing along specific crystal directions leaving grooves on the surface.

As alternatives to the traditional abrasive polishing methods, various physical and chemical means have been explored to etch or polish diamond films. These alternative methods can be generally classified as thermochemical, chemomechanical or plasma/ion beam/laser polishing.

Thermochemical techniques generally involve mechanical contact of the diamond film to certain metals at elevated temperatures. In this case, the diamond surface is put in, not only mechanical, but also thermal contact, typically with a spinning hot plate. Commonly, iron is the preferred plate material since, above 723° C., the solubility of carbon in an iron matrix increases, and thus, unwanted diamond asperities can be dissolved in the iron matrix. However, the technique offers polished films with a non-diamond surface having inter-grain contamination.

Plasma, ion beam, and laser polishing are non-contact polishing techniques, which generally do not require bulk sample heating and can be used on nonplanar surfaces. To date, the material removal rates of these techniques have been small. Additionally, these techniques require a controlled environment, generally a vacuum, and require expensive equipment.

It is well known that a diamond can be etched by exposure to an etching agent such as potassium nitrate or potassium chlorate at elevated temperatures, generally above 600° C. However, etching generally results in a deeply pitted diamond surface with the etching occurring preferentially at dislocations and other defects.

For example, Purohit et al. U.S. Pat. No. 5,133,792, issued Jul. 28, 1992, discloses a method of cleaning and refining by soaking diamonds in caustic or acidic solutions for durations of possibly more than a day at temperatures in the range from about 200° C. to about 500° C.

Chemical mechanical methods generally include a first polishing step in which the diamond film is coarsely polished by lapping against a polycrystalline alumina plate in the presence of fused potassium nitrate. Next, the diamond film is finely polished by lapping against another diamond film in the presence of fused potassium nitrate. However, the resultant diamond film has amorphous non-diamond contamination on the surface, probably from the mating diamond film surface or from execessive heating.

While various prior art methods and apparatus for polishing diamond films and products from diamond films exist, they each suffer from one or more disadvantages. The ideal processing method would both polish and planarize, as well as be non-contaminating to the diamond surface. Additionally, whether or not the techniques contaminate the diamond surface is important.

For example, thermochemical, ion beam, and mechanical lapping methods all achieve reasonable levels of polishing but fail to planarize the diamond film. Additionally, while laser methods produce polishing on the order of 0.05 microns, contamination by the formation of graphitic or diamond-like carbon layers occurs. While ion beam methods produce a surface finish on the order of 0.005 microns, the surface roughness is non-uniform due to ion-beam non-uniformity. Plasma methods achieve highly non-uniform polishing and contamination in the form of residue formation on the surface in grain boundaries. Mechanical lapping methods produce polishing on the order of 0.02 microns, but cause surface structural deformations, a type of defect, on micro scale.

Also, while the thermochemical technique offers a fine surface finish, surface non-uniformities are introduced from the abraiding metal surface. Contamination occurs from the formation of a diamond-like carbon layer and metal residue in the grain boundaries.

Although not related to the diamond film processing art area, a method of creating a planarized surface on top of a silicon wafer having electrical components is disclosed in "Searching for Perfect Planarity", Peter H. Singer, Semiconductor International, March 1992. However, the disclosed method does not create a planarized surface from the silicon wafer itself, but rather creates a planarized polymer layer on top of the silicon wafer, which layer encapsulated the electrical components supported by the wafer.

Thus, while the above described methods of processing diamond films offer polished diamond surfaces and provide some improvement in the waviness or planarization, they still suffer from one or more deficiencies.

Additionally, while some techniques can provide improvement in local planarization, i.e., across local portions of the substrate, most of them cannot provide truly global planarization, i.e. across the entire substrate.

Also, most polishing techniques generally result in the creation of imperfections on the diamond film surface, or in the exposure of subsurface microcavities between diamond crystals which also results in imperfections on the diamond film surface. This fact puts a natural limit on the achievable degree of surface finish by polishing.

Therefore, there is a need in the art for an improved method of processing diamonds and diamond-like materials.

There is another need for improved products made from diamond films and diamond-like material films.

There is yet another need in the art for improved planarized diamond films and diamond-like material films, improved products made thereof, and for an improved method of planarizing diamond films and diamond-like material film products.

There is even another need in the art for improved polished diamond films and diamond-like material films, improved products made thereof, and an improved method of polishing diamond films and diamond-like material film products.

These and other needs in the art will become readily apparent to one of skill in the art of this invention upon reading this specification.

SUMMARY OF THE INVENTION

It is one object of the present invention to provide for an improved method of processing diamonds and diamond-like materials, including the processing of diamond films and diamond-like material films.

It is another object of the present invention to provide for improved products made from diamonds and diamond-like materials, including improved products made from diamond films, and diamond-like material films.

It is yet another object of the present invention to provide for improved planarized diamonds and diamond-like materials, improved products made thereof, and for an improved method of planarizing diamonds and diamond-like materials, including improved planarized diamond films and diamond-like material films, improved products made from such films, and for an improved method of planarizing diamond films and diamond-like material films.

It is even another object of the present invention to provide for improved polished diamond and diamond-like materials, improved products made thereof, and an improved method of polishing diamonds and diamond-like products, including improved polished diamond films and diamond-like material films, improved products made from such films, and an improved method of polishing diamond films and diamond-like material film products.

These and other objects of the present invention will become readily apparent to one of skill in the art of this invention upon reading this specification.

Through theoretical research, the inventors have surprisingly and unexpectedly found that a substantial portion of the diamond film surface area may include a filler material without substantially affecting the thermal spreading efficiency of the diamond film. From this surprising and unexpected finding, the inventors conceived of the use of filler material in the various types of orifices found on the surface of the diamond film for achieving planarization.

Therefore, according to one embodiment of the present invention there is provided a method of planarizing diamond films and diamond-like material films or substrates utilizing filler materials. The method of the present invention for planarizing diamond films and diamond-like material films will generally include first optionally polishing the film utilizing any suitable polishing technique. The next step in the process of the present invention is to apply a suitable filler material to the surface of the film to fill in the various orifices, such as crevices, cracks, grooves, exposed microcavities, scratches, slits, slots, openings, hollow portions, cavities, chambers, notches, pits, holes, or other voids on the surface of a diamond film. Finally, any excess filler material on top of the diamond film surface may be removed utilizing a polishing procedure to produce a planarized film or substrate. In general suitable materials for use as the filler material include inorganic and/or organic materials, metals, glasses, spin-on glasses, thermoplastic polymers, thermoset polymers, engineering thermoplastic polymers, thermally reflowing materials, photo-activated polymers, and mixtures thereof. These filler materials can be applied in solid, liquid, gaseous form or mixtures thereof.

According to another embodiment of the present invention there are provided planarized diamond substrates. These diamond substrates generally include a diamond layer having orifices on the surface. These substrates also generally include the filler material described above, that is deposited in the orifices.

DETAILED DESCRIPTION OF THE INVENTION

Figure 1:
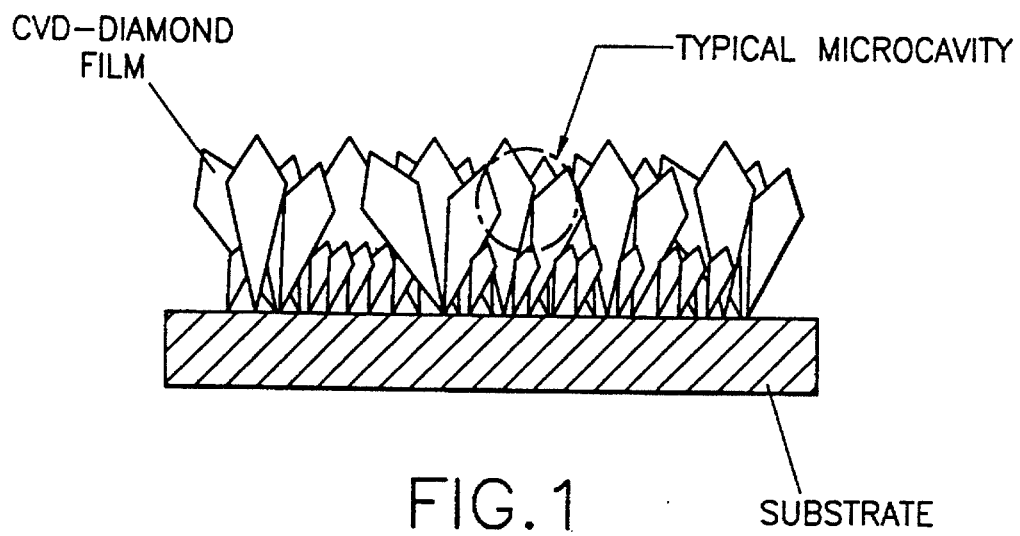
FIG. 1 is a cross-sectional view of a chemical-vapor deposited diamond film grown on a substrate showing a typical microcavity between the diamond crystals.
Figure 2:
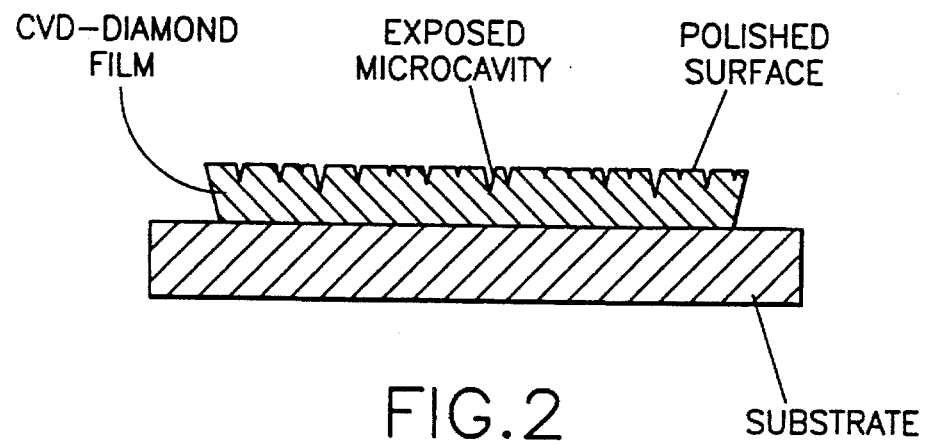
FIG. 2 is a cross-sectional view of the diamond film of FIG. 1 after polishing showing the polished surface and exposed microcavities.
Figure 3:
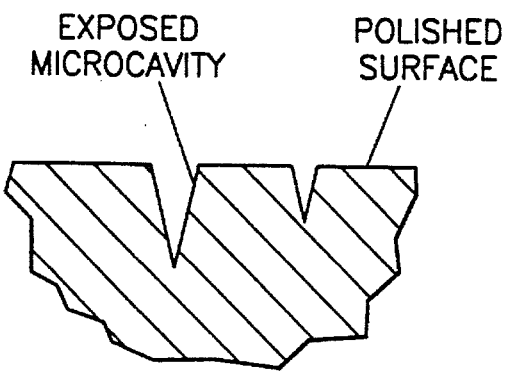
FIG. 3 is an enlarged view of a representative portion of the polished surface of FIG. 2 showing typical microcavities.

The present invention will be described first by reference to FIGS. 1 to 5. FIG. 1 is a cross-sectional view of a chemical-vapor deposited diamond film prior to polishing showing a typical microcavity between the diamond crystals. As evident in FIG. 1, a polycrystalline diamond film contains microcavities between the diamond crystals. FIG. 2 is a cross-sectional view of the diamond film of FIG. 1 after polishing. As is shown in FIG. 2, polishing generally results in the removal of the tops of the crystals which exposes microcavities, thus forming orifices on the surface of the film. FIG. 3 is an enlarged view of a representative portion of the polished surface of FIG. 2 showing typical microcavities. The polishing process may also create orifices due to the scratching or dislodging of diamond grains from the surface being polished. Thus, while polishing may result in a reduced average surface roughness, various orifices, such as crevices, cracks, grooves, exposed microcavities, scratches, slits, slots, openings, hollow portions, cavities, chambers, notches, pits, holes, or other voids, may end up on the surface of the polished film which also affect the planarity of the film.

Figure 4:
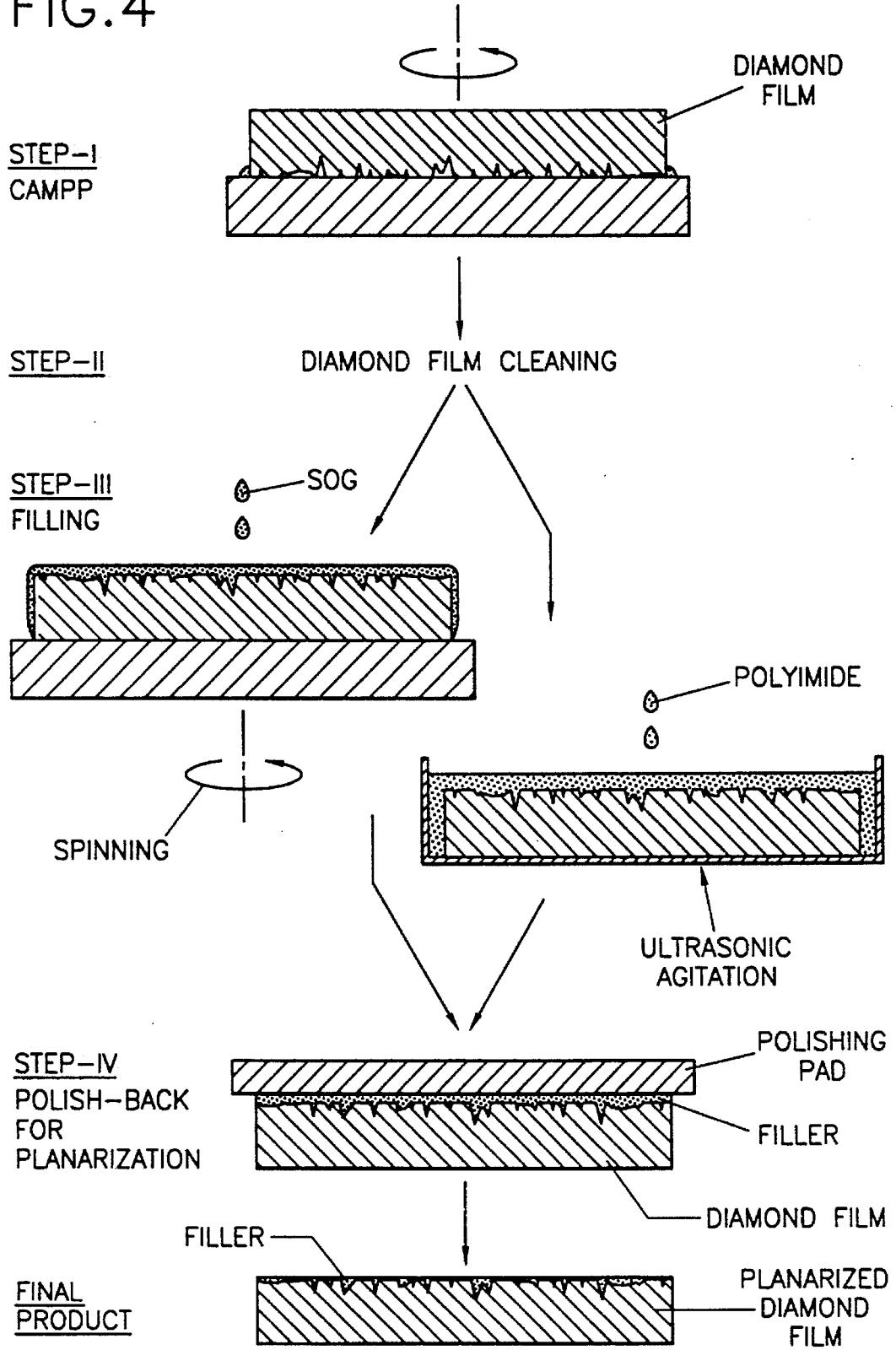
FIG. 4 is a schematic representation of the method of the present invention.
Figure 5:
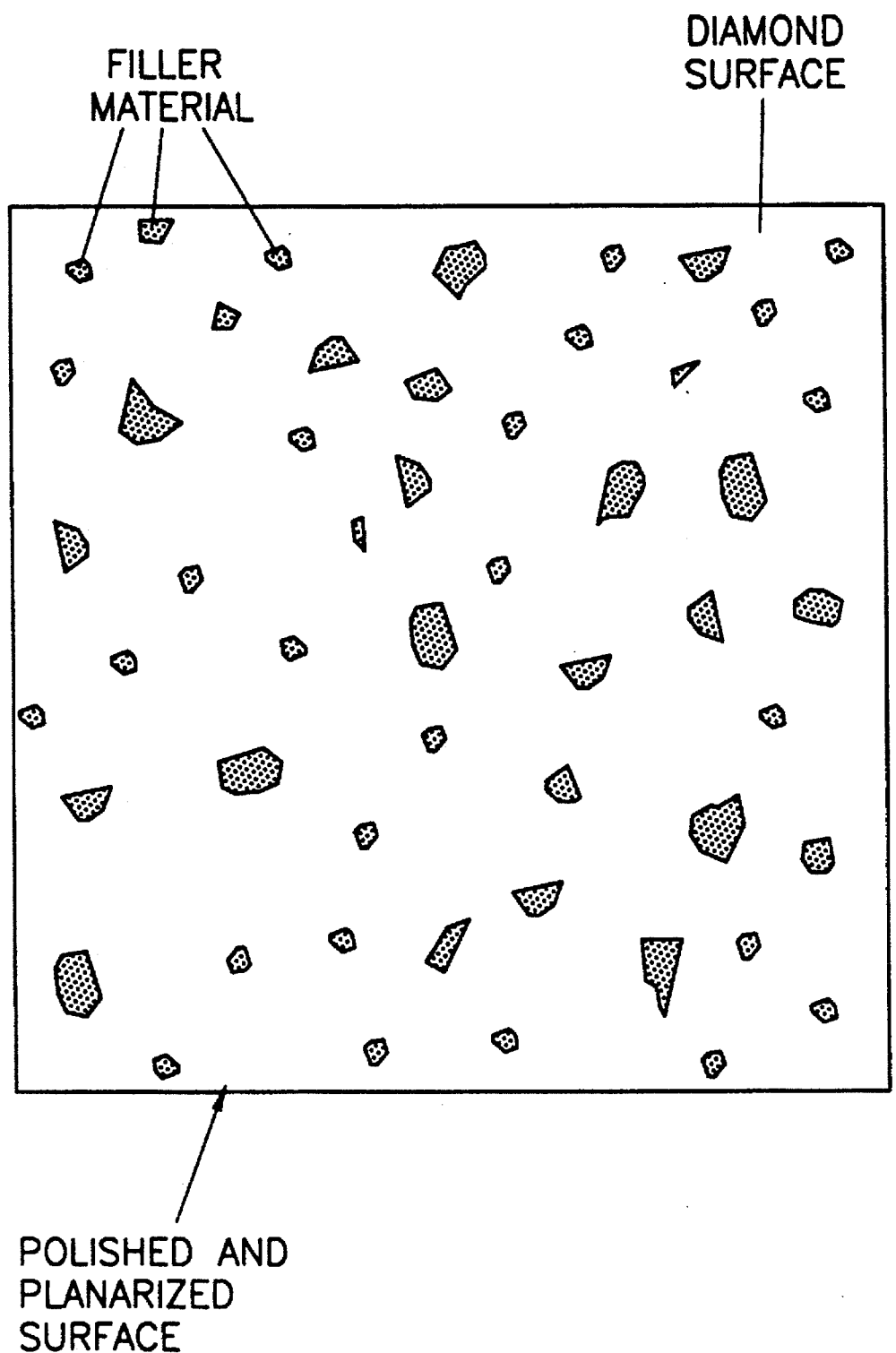
FIG. 5 is a view of a diamond film after processing according to the present invention showing the top polished and planarized diamond film surface having both diamond and filler areas.

Referring now to FIG. 4, there is shown a schematic representation of the method of the present invention. Step I as shown in the FIG. 4 is an optional step of polishing the diamond film by any suitable polishing procedure. The polishing step is optional, as the need for polishing will depend on the physical and/or chemical condition of the film and the desired end use application. As shown in FIG. 4, Step II involves the cleaning of the diamond film with a suitable chemical cleaner to enhance the adhesion of the filler material to the film. Although not shown in FIG. 4, application of other materials which may enhance the adhesion of the filler material to the film may also be utilized. Additionally not shown in FIG. 4, prior to the filling process of Step III, two or more suitable filler materials may be mixed together to provide the desired properties in the final film product. Step III of FIG. 4 involves the application of filler material to the film to fill orifices on the surface of the film. While FIG. 4 depicts application of the filler material to a spinning film or in combination with ultrasonic agitation, it is to be understood that any suitable scheme may be utilized to apply the filler material to the film. Step IV is an optional step and is the polishing of the surface to remove excess filler material and expose the polished diamond surface to create a polished and planarized diamond film. However, for some applications, excess filler need not be removed completely. In the embodiments shown in FIG. 4, the filler materials utilized are spin-on-glass ("SOG") and polyimide. FIG. 5 is a view of the diamond film after processing according to the present invention showing the top polished and planarized diamond film surface having both diamond and filler areas.

The diamond films or substrates utilized in the present invention may be produced using any suitable method and means. Common methods of producing deposited films include ion beam deposition, chemical vapor deposition, plasma enhanced chemical vapor deposition, physical vapor deposition and sputter deposition. In the practice of the present invention, the preferred method of producing a deposited film is by chemical vapor deposition.

Briefly, ion beam deposition typically involves producing ions of selected energies for deposition on a substrate. Chemical vapor deposition and plasma enhanced chemical vapor deposition methods are similar in operation. Both methods use the dissociation of organic or inorganic vapors to produce excited carbon and/or hydrocarbon species for deposition on a substrate. Finally, sputtering deposition usually includes two ion sources, one for sputtering excited carbon from a graphite source onto a substrate, and another ion source to break the unwanted graphite bonds in the growing film.

In the practice of the present invention, any suitable polishing method or means may be utilized. Examples of suitable polishing methods include any of those discussed above in the Description of the Related Art section of this application, including abrasive polishing, thermochemical polishing, chemomechanical polishing or, plasma, ion beam, or laser polishing.

Preferably, the polishing method utilized is the chemical-assisted mechanical polishing process ("CAMPP") disclosed in U.S. patent application Ser. No. 08/239,362, entitled "Apparatus for and Method of Polishing and Planarizing Polycrystalline Diamonds, and Polished and Planarized Polycrystalline Diamonds and Products Made Therefrom", filed May 6, 1994 by Ajay P. Malshe, Hameed Naseem and William D. Brown, which is herein incorporated by reference.

This preferred chemical-assisted mechanical polishing method generally includes abrasively polishing the diamond or diamond-like carbon film with a hard surface in the presence of one or more chemicals. Examples of chemicals which may be utilized include potassium chloride, potassium nitrite, potassium hydroxide, sodium hydroxide, sodium nitrate, sodium nitrite, chromium trioxide, potassium-dichromate, manganese oxide, potassium chromate and mixtures thereof. Most preferably, the abrasive polishing is carried out in the presence of potassium nitrate and potassium hydroxide, with the weight ratio of potassium nitrate to potassium hydroxide preferably in the range of about 90:10 to about 99:1.

Once the film or substrate is at the desired level of polishing, the surface of the film or substrate is generally cleaned with a chemical cleaner or solvent to assist adhesion of the filler material to the surface. Suitable cleaners and solvents include saturated solution of chromium trioxide in sulfuric acid, hydrogen peroxide and $NH_4OH$, trichloroethane, deionized water, methanol, acetone, and any other suitable organic or inorganic solution. Preferably, the cleaner or solvent utilized is a saturated solution of chromium trioxide in sulfuric acid.

The practice of the present invention also includes the application of a suitable filler material to the surface of the diamond film or substrate. Generally, any suitable filler material, or combinations of filler material, may be applied to the surface of the diamond film to fill the orifices, which may be present as crevices, cracks, grooves, exposed microcavities, scratches, slits, slots, openings, hollow portions, cavities, chambers, notches, pits, holes, or other voids or irregularities.

Generally, filler material may be applied in any suitable form including soild, liquid, gaseous form, or combinations thereof. Filler application may be by any suitable method.

In most cases, the filler application temperature will generally be less than the degradation temperature of the film or substrate, although in some instances higher temperatures may be utilized. For diamond films, the onset of degradation generally occurs at about 900K in an oxygen ambient and at about 1800K in an inert environment. For example, if the filler material is applied as a liquid, it is preferred that the melting temperature of the filler material be less than the degradation temperature of the film or substrate.

Other techniques that may be utilized to apply filler materials to the diamond film include spin-on applications, and chemical vapor deposition of $SiO_2$, nitrides or TEOS-$SiO_2$ films as filler material.

The diamond substrate will generally be further processed and then utilized for a certain end application. Therefore, it is also preferred that the filler material remain contiguous with the substrate during further processing and during the end application. It is also necessary that the filler material not suffer any undesirable degradation during subsequent processing and end use.

Additional desired physical and electrical properties of the filler material will generally be dictated by the end use of the diamond film or substrate. For example, other filler material properties of interest may include thermal spreading efficiency, coefficient of thermal expansion, thermal and electrical conductivity, dielectric constant, tensile strength, wear resistance, optical properties, and hardness.

The choice of filler material will generally be influenced by the ultimate desired end use of the film. In general suitable materials for use as the filler material include inorganic and/or organic materials, metals, glasses, spin-on glasses, thermoplastic polymers, thermoset polymers, engineering thermoplastic polymers, thermally reflowing materials, and mixtures thereof. Specific examples of filler materials useful in the present invention include acrylics, alkyds, amino resins, cyclotene resins based on benzocyclobutene ("BCB"), epoxides, fluorocarbons, inorganic materials such as $SiO_2$, SiN or SiC, nylons, oxy-nitrides, phenolics, photosensitive polymers, polyamides, polyesters, polyethylene, polyimides, polyolefins, polyolefin copolymers, polyphenylene oxides, polyphenylene sulfides, polypropylene, polystyrenes, polysulfones, polyurethanes, polyvinyl chloride, spin-on-glass, and the like, and mixtures thereof. Preferably, the filler material is selected from the group consisting of spin-on glass or polyimides.

The filler materials may also include other additives such as crosslinking agents, antioxidants, processing aids, pigments, dyes, colorants, metal deactivators, organic and inorganic materials, gases, diamond grit or particles, particles of diamond-like materials, polymer particles, ceramic or metal materials, oil extenders, stabilizers, lubricants, and others additives known to those of skill in the art. Preferable materials to include with filler material includes diamond grit or particles, diamond-like particles, metal particles, ceramic particles, or mixtures thereof. These other additives may be in solid, liquid, or gaseous form, or mixtures thereof. These other additive may also be in any suitable size or shape, including particles, grit or any other geometric shape.

Once applied, the filler material is preferably solidifed, although it is noted that in certain applications, it may be desirable that the filler material be in a liquid form, or in a gel form, rather than solidified.

In the practice of the present invention, the filler material is applied to the surface of the diamond film or substrate, preferably as a liquid. The filler material may be applied to the diamond film or substrate utilizing any suitable application method or means. An example of a suitable application method includes spin-on application in which the liquid glass precursor material is applied to a spinning substrate, followed by temperature cycling, or any other suitable method to cure and/or solidify the filler into a glassy matrix. Another example includes simply pouring the filler onto the surface of the substrate, with the substrate subjected to agitation, vibration or other energetic means, to consolidate the filler material and/or remove trapped air bubbles, followed by temperature cycling to cure and/or solidify the filler. An example of still another method of applying the coating includes spray coating.

In general, any suitable method may be utilized to consolidate and/or remove trapped air bubbles. For example, an agitation energy source may be utilized to consolidate and/or remove trapped air bubbles. Such suitable agitation energy may be applied to the filler material prior to, during, and/or after application of the filler material to the substrate. As another example, the squeegee method may be utilized in which a thioxotropic filler is forced into these crevices under pressure of a squeegee to be later cured by heat, UV light or other curing method.

Once the filler material is applied to the substrate and solidified, this filler surface is then preferably subjected to polishing to expose the diamond surface. It is noted that in certain end uses, it is desired that none of the filler material be removed, in which case, this polishing step is skipped.

In the practice of the present invention, any suitable polishing method or means may be utilized to polish the filler surface and expose the diamond surface. Examples of suitable polishing methods include any of those discussed above in the Description of the Related Art section of this application, including abrasive polishing, thermochemical polishing, chemomechanical polishing or, plasma, ion beam, or laser polishing.

An example of a polishing method which may be utilized at this point in the process is the chemical-assisted mechanical polishing method disclosed in U.S. patent application Ser. No. 08/239,362, entitled "Apparatus for and Method of Polishing and Planarizing Polycrystalline Diamonds, and Polished and Planarized Polycrystalline Diamonds and Products Made Therefrom", filed May 6, 1994 by Ajay P. Malshe, Hameed Naseem and William D. Brown, which is herein incorporated by reference.

FIG. 5 shows that the processed substrate surface area which includes both polished filler material areas and polished diamond areas. In the practice of the present invention, the substrate surface can generally comprise any percentage of filler material area and can generally comprise any percentage of diamond area. The exact percentage of filler material area utilized and the exact percentage of diamond area utilzed will depend upon the desired end use of the substate, the properties of the filler material utilized, process economics, as well as other factors.

For example, while any suitable percentages may be utilized, it is generally desired for thermal management that at least 1 percent of the surface area of the polished surface area comprise diamond or diamond-like material, with the remainder comprising filler material. Preferably, at least 25 percent of the surface area of the polished surface area comprise diamond or diamond-like material, with the remainder comprising filler material. More preferably, at least 50 percent of the surface area of the polished surface area will comprise diamond or diamond-like material, with the remainder comprising filler material. Most preferably, at least 75 percent of the surface area of the polished surface area will comprise diamond or diamond-like material, with the remainder comprising filler material.

The method of the present invention finds utility in treating surfaces comprising diamond, ceramic, metal oxides such as $Al_2O_3$, nitrides such as such as cubic BN, SiN, AlN, TiN, NbN, ZrN and HfN, carbides such as SiC, TiC, NbC, ZrC, HfC and WC, or any other diamond-like coatings and combinations thereof.

The processed materials of the present invention will generally have a thickness variation of less than about 8 percent, and preferably less than about 5 percent. More preferably, the processed materials of the present invention will have a thickness variation of less than about 2 percent, and most preferably less than about 1 percent.

The processed materials of the present invention, especially highly polished and planarized diamond films, will find utility in thermal management, electrical, optical, tribological applications, biomedical applications such as artificial joint coatings and surgical equipment, as well as a whole host of other applications.

EXAMPLE

Example 1 Properties Of Diamond Film With Filler

ANSYS, a commercially available simulation package, was used to model the thermal management efficiency of a 100% diamond surface, and a second surface comprising a 50% diamond surface and a 50% filler material surface. A 10 cm×10 cm×1 mm thick substrate with alternating diamond and filler cube surface was considered. The surface comprises cubes which were each 1 cm×1 cm×100 microns (deep). The thermal conductivity of the diamond cubes within the matrix was 2000 W/m-K, and the thermal conductivity of the filler cubes within the matrix was $10^{-3}$ W/m-K. The simulation was run holding two opposite 1 mm thick edges of the matrix at 300K, and with a power dissipation of 10 W/cm$^2$ positioned on top of the matrix. The maximum increase in the temperature at the center of the diamond/filler matrix is only about 3.32K more than for the diamond-only matrix. The results are presented in Table 1 as follows:

TABLE 1

| Pure Diamond Substrate Temperature (K) | Diamond/Filler Substrate Temperature (K) | Temperature Difference (K) |
| --- | --- | --- |
| 300 ($T_{min}$) | 300 ($T_{min}$) | 0 |
| 306.95 | 307.31 | 0.36 |
| 313.89 | 314.63 | 0.74 |
| 320.84 | 321.95 | 1.11 |
| 327.79 | 329.26 | 1.47 |
| 334.73 | 336.58 | 1.84 |
| 341.68 | 343.89 | 2.21 |
| 348.62 | 351.21 | 2.59 |
| 355.57 | 358.52 | 2.95 |
| 362.52 ($T_{max}$) | 365.84 ($T_{max}$) | 3.32 ($T_{max\ dif}$) |

Example 2 Planarizing A Diamond Film With Spin-On-Glass ("SOG")

A diamond film substrate, produced by conventional chemical vapor deposition process, having a cross-sectional area of 1 cm$^2$, an average thickness of about 700 microns, a typical surface roughness of about 2.7 microns, and having about 8% variation in the thickness was utilized in this example.

The substrate was first cleaned in "aqua regia", a mixture of nitrohydrochloric acid, chloronitrous acid and chlorazotic acid, then rinsed in deionized water, followed by ultrasonic cleaning in methanol, after which it was dried utilizing dry nitrogen.

The diamond film was then polished using the preferred chemical assisted mechanical polishing method discussed above in the Detailed Description Of The Invention section of this specification, using a 95:5 by weight mixture of potassium nitrate and potassium hydroxide, at a processing temperature of 385° C. The polished film had an average surface roughness of about 0.4–0.7 microns, and a planarization of about 5 percent. After polishing, the polished film was cleaned again with aqua regia.

A coating of spin-on-glass, available from Allied Signal as SOG X2515, was applied to the polished film as follows.

The polished diamond film was first subjected to 10 minutes of ultrasonic cleaning in trichloroethylene, followed by 10 minutes of ultrasonic cleaning in acetone, which was followed by 10 minutes of ultrasonic cleaning in methanol.

Three hot plates are maintained at 80° C., 150° C. and 250° C., and an oven maintained at 425° C.

The SOG X2515 is removed from refrigeration and allowed to reach ambient room temperature in the range of about 20° C. to about 25° C. The SOG X2515 is poured onto the polished diamond film with a syringe and subjected to spinning at 3000 rpm for 20 seconds.

The diamond film is then baked for one minute each on the 80° C., 150° C. and then 250° C. hot plates, and then placed in the oven maintained at 425° C. for one hour to cure the SOG X2515.

A second SOG X2515 coating was then applied using the same procedure above.

Example 3 Planarizing A Diamond Film With Polyimide ("PI")

A diamond film substrate, produced by a conventional chemical vapor deposition process, having a cross-sectional area of 1 cm$^2$, an average thickness of about 700 microns, a typical surface roughness of about 2.7 microns, and having about 8% variation in the thickness was utilized in this example.

The substrate was first cleaned in "aqua regia", a mixture of nitrohydrochloric acid, chloronitrous acid and chlorazotic acid, then rinsed in deionized water, followed by ultrasonic cleaning in methanol, after which it was dried utilizing dry nitrogen.

The diamond film was then polished using the preferred chemical assisted mechanical polishing method discussed above in the Detailed Description Of The Invention section of this specification, using a 95:5 by weight mixture of potassium nitrate and potassium hydroxide, at a processing temperature of 385° C. The polished film had a surface roughness of about 0.4 to about 0.7 microns, and a planarization of about 5 percent.

After polishing, the polished film was cleaned again with aqua regia.

Pyralin PD polyimide, PI-2721 available from DuPont in the precurser liquid form, was applied to the diamond film as follows.

The diamond film is subjected to 5 to 10 minutes of ultrasonic cleaning in trichloroethylene, followed by 5 to 10 minutes of ultrasonic cleaning in acetone, followed by 5 to 10 minutes of ultrasonic cleaning in and methanol.

The diamond film was placed in the bottom of a suitable container, with the polyimide slowly poured into the container until the liquid level is just above the top plane of the diamond film, and exposed to ultrasonic agitation for 5 to 10 minutes.

After the ultrasonic agitation, the diamond film/polyimide part is removed from the container, with the excess polyimide removed from the diamond film. The sample is then placed on a 5.00" silicon wafer as a carrier wafer.

To cure the polymer, the diamond film is then placed in a convection oven in which the temperature is ramped from ambient (20° C.–25° C.) to about 150° C. in 10 minutes. The oven temperature is then held at 150° C. for 30 minutes. The oven temperature is then ramped to 280° C. in about 20 minutes, followed by a 30 minute hold at 280° C.

The diamond film is removed from the convection oven and placed in a 100 inch, six zone infrared belt oven. Zone 1 temperature is set at 275° C., zone 2 and 3 temperatures are set at 300° C. Combined zones 4, 5, and 6 is a cooling zone having an ambient nitrogen purge. Track speed was 1.5 cm/min in a $N_2$ atmosphere, with $N_2$ flowrate at 40 ml/min. Residence time in zone 1, zone 2, zone 3 and the combined cooling zone was about 13.5 minutes, 6.8 minutes, 13.5 minutes, and 135.5 minutes, respectively.

Once the diamond film is removed from the belt oven it is polished using an Ecomet 40 Buehler polishing machine, which utilizes a texmat polishing cloth on the bottom rotating plate. With 1 micron sized diamond paste on the polishing cloth, the diamond film is held against the rotating plate until the cured polyimide is removed from the surface of the diamond sample.

While the illustrative embodiments of the invention have been described with particularity, it will be understood that various other modifications will be apparent to and can be readily made by those skilled in the art without departing from the spirit and scope of the invention. Accordingly, it is not intended that the scope of the claims appended hereto be limited to the examples and descriptions set forth herein but rather that the claims be construed as encompassing all the features of patentable novelty which reside in the present invention, including all features which would be treated as equivalents thereof by those skilled in the art to which this invention pertains.

I claim:

1. A method of processing a diamond film having a surface defining a multiplicity of orifices, the method comprising:

(a) contacting the diamond film surface with a filler material to overfill at least one of the orifices; and (b) polishing the surface of the film to remove overfilled filler material, exposing the diamond surface and creating a polished and planarized diamond and filler surface.

2. The method of claim 1 wherein the filler material is selected from the group of materials consisting of inorganic materials, organic materials, metals, glasses, spin-on glasses, thermoplastic polymers, thermoset polymers, engineering thermoplastic polymers, thermally reflowing materials, and mixtures thereof.

3. The method of claim 1 wherein the filler material is selected from the group of materials consisting of acrylics, alkyds, amino resins, cyclotene resins based on benzocyclobutene, epoxides, fluorocarbons, $SiO_2$, SiN, SiC, nylons, oxy-nitrides, phenolics, photo-sensitive polymers, polyamides, polyesters, polyethylene, polyimides, polyolefins, polyolefin copolymers, polyphenylene oxides, polyphenylene sulfides, polypropylene, polystyrenes, polysulfones, polyurethanes, polyvinyl chloride, spin-on-glass, and mixtures thereof.

4. The method of claim 3 wherein the filler material further includes materials selected from the group of materials consisting of diamond particles, polymer particles, diamond-like particles, ceramic particles, and metal particles.

5. The method of claim 1 wherein the filler material is selected from the materials consisting of spin-on-glass and polyimides.

6. The method of claim 5 wherein step (a) further includes curing the filler material.

7. The method of claim 1 wherein step (a) further includes vibrating the contacted diamond film and filler material.

8. The method of claim 1 wherein prior to step (a) the diamond film is polished.

9. The method of claim 1 wherein prior to step (a) a filler adhesion aid is applied to the diamond film.

10. The method of claim 1 wherein the orifices comprise at least one of crevices, cracks, grooves, exposed microcavities, scratches, slits, slots, openings, hollow portions, cavities, chambers, notches, pits, holes, and voids.

11. A method of processing a diamond film comprising:
   (a) polishing the diamond film to create a polished diamond film surface having orifices on the surface;
   (b) contacting the diamond film surface with a filler material to overfill at least one of the orifices; and
   (c) polishing the surface of the film to remove overfilled filler material, expose the diamond surface and create a polished diamond and filler surface.

12. The method of claim 11 wherein the filler material is selected from the group of materials consisting of inorganic materials, organic materials, metals, glasses, spin-on glasses, thermoplastic polymers, thermoset polymers, engineering thermoplastic polymers, thermally reflowing materials, and mixtures thereof.

13. The method of claim 11 wherein the filler material is selected from the group of materials consisting of acrylics, alkyds, amino resins, cyclotene resins based on benzocyclobutene, epoxides, fluorocarbons, $SiO_2$, SiN, SiC, nylons, oxy-nitrides, phenolics, photo-sensitive polymers, polyamides, polyesters, polyethylene, polyimides, polyolefins, polyolefin copolymers, polyphenylene oxides, polyphenylene sulfides, polypropylene, polystyrenes, polysulfones, polyurethanes, polyvinyl chloride, spin-on-glass, and mixtures thereof.

14. The method of claim 11 wherein the filler material is selected from the materials consisting of spin-on-glass and polyimides.

15. The method of claim 14 wherein the filler material further includes materials selected from the group of materials consisting of diamond particles, diamond-like particles, polymer particles, ceramic particles, and metal particles.

16. The method of claim 14 wherein step (b) further includes curing the filler material.

17. The method of claim 11 wherein step (b) further includes agitating the contacted diamond film and filler material.

18. The method of claim 11 wherein prior to step (b) a filler adhesion aid is applied to the diamond film.

19. The method of claim 11 wherein the orifices comprise at least one of crevices, cracks, grooves, exposed microcavities, scratches, slits, slots, openings, hollow portions, cavities, chambers, notches, pits, holes, and voids.

20. A method of processing a diamond film comprising:
   (a) polishing the diamond film to create a polished diamond film surface having orifices on the surface; and
   (b) contacting the diamond film surface with a filler material to overfill at least one of the orifices.

21. The method of claim 20 wherein in step (b), the diamond film surface is contacted with a sufficient amount of filler material to cover the diamond film surface.

22. A planarized diamond film comprising a diamond substrate with a polished surface area comprising both a polished diamond surface area and a polished filler material surface area, wherein the polished diamond surface area defines a multiplicity of orifices which contain the filler material.

23. The planarized diamond film of claim 22 wherein the filler material is selected from the group of materials consisting of acrylics, alkyds, amino resins, cyclotene resins based on benzocyclobutene, epoxides, fluorocarbons, $SiO_2$, SiN, SiC, nylons, oxy-nitrides, phenolics, photo-sensitive polymers, polyamides, polyesters, polyethylene, polyimides, polyolefins, polyolefin copolymers, polyphenylene oxides, polyphenylene sulfides, polypropylene, polystyrenes, polysulfones, polyurethanes, polyvinyl chloride, spin-on-glass, and mixtures thereof.

24. The planarized diamond film of claim 22 wherein the filler material is selected from the group of materials consisting of spin-on-glasses and polyimides.

25. The planarized diamond film of claim 22 wherein the polished surface area comprises at least 25 percent polished diamond surface area.

26. The planarized diamond film of claim 22 wherein the film has a thickness variation of less than about 5 percent.

27. The planarized diamond film of claim 22 wherein the filler material is selected from the group consisting of spin-on-glasses and polyimides, the polished surface area comprises at least 50 percent polished diamond surface area, and the film has a thickness variation of less than about 2 percent.

\* \* \* \* \*